United States Patent
Shumarayev et al.

(10) Patent No.: US 7,782,088 B1
(45) Date of Patent: Aug. 24, 2010

(54) SHARING ADAPTIVE DISPERSION COMPENSATION ENGINE AMONG PROGRAMMABLE LOGIC DEVICE SERIAL INTERFACE CHANNELS

(75) Inventors: Sergey Shumarayev, Los Altos Hills, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 827 days.

(21) Appl. No.: 11/675,335

(22) Filed: Feb. 15, 2007

(51) Int. Cl.
*H01L 25/00* (2006.01)
*H03K 19/177* (2006.01)

(52) U.S. Cl. .................... 326/41; 326/37; 326/38

(58) Field of Classification Search ............... None
See application file for complete search history.

(56) References Cited

U.S. PATENT DOCUMENTS

| | | | |
|---|---|---|---|
| 4,066,977 | A | 1/1978 | Chambers et al. |
| 4,667,179 | A | 5/1987 | Law et al. |
| 6,870,404 | B1 | 3/2005 | Maangat |
| 2001/0023177 | A1 | 9/2001 | Tanaka |
| 2004/0178851 | A1 | 9/2004 | Ishida et al. |
| 2005/0095988 | A1 | 5/2005 | Bereza et al. |
| 2007/0014344 | A1 | 1/2007 | Maangat et al. |
| 2007/0041455 | A1* | 2/2007 | Tran et al. .................... 375/257 |
| 2007/0071084 | A1 | 3/2007 | Lai et al. |
| 2008/0069276 | A1* | 3/2008 | Wong et al. ................. 375/350 |

FOREIGN PATENT DOCUMENTS

| | | |
|---|---|---|
| JP | 61-133713 | 6/1986 |
| SU | 1658378 | 6/1991 |
| WO | WO 97/36372 | 10/1997 |
| WO | WO 02/05423 | 1/2002 |

OTHER PUBLICATIONS

Choi, J-S., et al., "A 0.18-μm CMOS 3.5-Gb/s Continuous-Time Adaptive Cable Equalizer Using Enhanced Low-Frequency Gain Control Method," *IEEE Journal of Solid-State Circuts*, (39)3:419-425 (Mar. 2004).

"Least Mean Squares Filter," http://en.wikipedia.org/wiki/Least_mean_squares_filter, last modified Feb. 21, 2008, accessed on Apr. 7, 2008.

* cited by examiner

*Primary Examiner*—Anh Q Tran
(74) *Attorney, Agent, or Firm*—Ropes & Gray LLP; Jeffrey H. Ingerman

(57) ABSTRACT

In a programmable logic device (PLD) having a plurality of serial interface channels, the number of adaptive dispersion compensation engines (ADCEs), which adjust the equalization of each channel that requires it, is reduced. In one embodiment, one ADCE is provided for every group of channels (e.g., every group of two channels), and multiplexers are provided to connect the ADCE to one channel (or more) according to the user logic design. In another embodiment, one ADCE is provided for every group of channels, and time-division multiplexing (TDM) is used to connect the ADCE sequentially to every channel in the group that requires it. Because the time required to adjust each channel is small, theoretically all ADCEs on the PLD could be considered one group, sharing one ADCE by TDM. The TDM circuitry could be programmable to allow priority to be given to certain channels, so that they are adjusted first.

18 Claims, 2 Drawing Sheets

US 7,782,088 B1

SHARING ADAPTIVE DISPERSION COMPENSATION ENGINE AMONG PROGRAMMABLE LOGIC DEVICE SERIAL INTERFACE CHANNELS

BACKGROUND OF THE INVENTION

This invention relates to the sharing of an adaptive dispersion compensation engine (ADCE) among a plurality of high-speed serial interface channels, especially in a programmable logic device.

Programmable logic devices (PLDs) frequently incorporate high-speed serial interfaces to accommodate high-speed (i.e., greater than 1 Gbps) serial I/O standards. Typically, a PLD may have multiple high-speed serial interface channels. In use, different ones of such channels may have different characteristics, particularly if the user configures them for different standards, but also because of the length of the serial link involved and transmission conditions between the interface and the remote device. With multiple such channels all having different characteristics, the user is faced with the need to provide different amounts of equalization to compensate for attenuation. The amount of equalization of any particular setting in any particular channel may vary with backplane length, backplane type (e.g., backplane material), backplane aging, process conditions at the time of PLD manufacture, data rate, voltage, temperature, etc.

Manually determining the optimal settings for each link would be extremely time-consuming. There may be large numbers (e.g., hundreds or thousands) of permutations of various programmable settings in each channel. Moreover, selection of the appropriate combination of settings frequently is done by trial-and-error.

The STRATIX® II GX PLD, available from Altera Corporation, of San Jose, Calif., includes an integrated ADCE. The integrated ADCE automatically performs the trial-and-error examination of the output of the equalizer stages and adjusts the equalizer settings to increase or decrease the amount of equalization. This examination is performed in real time, adjusting to the changing environment and the aging process. In the STRATIX® II GX PLD, each transceiver channel is equipped with an ADCE. However, the ADCE adds significantly to the area occupied by each channel. The largest STRATIX® II GX device has twenty channels. Thus, the provision of an ADCE in each channel adds significantly to device size. In addition, because ADCEs are complex and therefore subject to fabrication difficulties, a large number of ADCEs on the PLD reduces yield.

Therefore, it would be desirable to be able to reduce the number of ADCEs on a PLD.

SUMMARY OF THE INVENTION

The present invention reduces the number of ADCEs on a PLD by sharing each ADCE among one or more channels.

In one preferred embodiment, a single ADCE is provided among a plurality of channels, with selectable connections to each of the channels. In use, the user selects, in accordance with the requirements of the user logic design with which the PLD is programmed, to which, if any, of the plurality of channels the ADCE is connected. As the number of channels sharing the ADCE increases, the savings in device area also increases. At the same time, however, the flexibility for the user, in terms of being able to use an ADCE with any channel that the user logic design calls for, decreases. Therefore, while in this embodiment, the number of channels that share an ADCE could be any number, preferably that number is two.

In another preferred embodiment, each ADCE could be shared by a plurality of channels—e.g., through time-division multiplexing.

Thus, in accordance with the present invention, there is provided a serial interface for use in a programmable logic device. The serial interface includes a first number of serial interface channels including equalization circuitry, where that first number is at least two, a second number of adaptive dispersion compensation engines for adjusting the equalization circuitry, where that second number is at least one and less than the first number, and selection circuitry for sharing each adaptive dispersion compensation engine among a group of serial interface channels including a third number of serial interface channels from among the first number of serial interface channels, where the third number is at most equal to the first number.

A programmable logic device incorporating such an interface is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
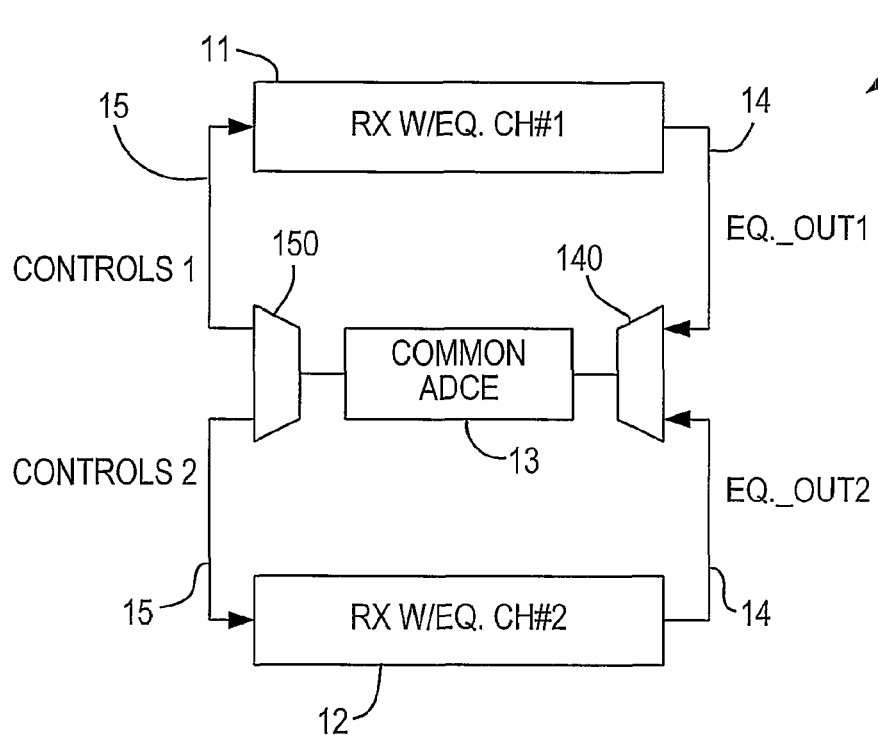
FIG. 1 is a schematic diagram of a portion of a programmable logic device according to a first preferred embodiment of the present invention.

As discussed above, the present invention reduces the number of ADCEs on a PLD by allowing sharing of each ADCE by a plurality of serial interface channels. In one preferred embodiment, this may be done by providing one ADCE for a certain number of channels, with the user deciding at the time of programming which channel, if any, will use the ADCE. In another preferred embodiment, this may be done by allowing each ADCE to be used sequentially by a plurality of channels—e.g., by time-division multiplexing.

In a first preferred embodiment, the number of ADCEs per serial interface channel preferably is provided based on a statistical analysis of how likely a user is going to need an ADCE for one channel. Statistically, it may be assumed that not every channel will need an ADCE. Indeed, a user logic design may not require any ADCEs. As long as there are enough ADCEs on the PLD, and the necessary connections are available from each ADCE to a reasonable number of channels, it should be possible to implement any user logic design requiring ADCEs. In a particularly preferred variant of this embodiment, one ADCE is provided for every two serial interface channels.

In accordance with this embodiment, each ADCE preferably is able to be programmably connected to any one of the plurality of serial interface channels with which it is associated. For example, each input or output of the ADCE may be connected to a multiplexer that selectably connects that input or output to any one of the associated channels. It will be understood that if multiplexers are used for the programmable connections, then normally all multiplexers on the inputs or outputs of a single ADCE will select the same channel. However, there may be circumstances—e.g., where it is desired to copy settings from a first channel to a second channel—where the ADCE input is connected to one first channel and the ADCE output is connected to another channel.

In a second preferred embodiment, each ADCE is connected sequentially to a plurality of channels through, e.g., time-division multiplexing. The number of channels that could simultaneously share a single ADCE is a function of how fast it takes the ADCE to set up one channel and whether all channels could be set up within an acceptable total set-up time.

Depending on details of a particular user logic design, the amount of time required to lock valid settings for an arbitrary channel can be determined. Based on that determination, each channel can be kept in control of the ADCE long enough for it to converge. The ADCE may be connected to each channel in round-robin fashion, allowing the ADCE to set up each channel sequentially.

In one variant of this embodiment, there may be only one ADCE for the entire PLD, serving all channels. This would result in a maximum savings in area. While the one ADCE would be required to set up all serial interface channels in use on the PLD, it has been observed that in most applications, the ADCE set-up time for each channel is not very long.

In a one-ADCE PLD embodiment in particular, but even when there is more than one ADCE on the PLD, to accommodate user logic designs where the set-up time matters, the user may be given the option to specify the order in which each channel is to be set up, or at least to identify certain channels as requiring set-up before other channels. In steady-state operation, after the initial set-up, the time-division multiplexing should not be an issue because normally conditions on a serial interface channel change slowly in use, so that readjustment of any channel whose equalization settings require readjustment should be able to be accomplished within the available time slot.

The invention will now be described with reference to FIGS. 1-3.

FIG. 1 illustrates the first embodiment described above, where one ADCE is provided for a plurality of channels, and is connected, at any one time in any one user logic design, to one channel out of that plurality of channels. In this embodiment 10, each channel 11, 12 preferably includes equalization circuitry and the two channels 11, 12 preferably share a common ADCE 13. Each channel 11, 12 preferably is connected to ADCE 13 by a respective channel output 14 which carries signals indicating the states of various equalization settings in the respective channel, and by a respective control line 15 by which ADCE 13 adjusts those settings.

The respective channel outputs 14 preferably are connected to ADCE 13 via multiplexer 140, while the respective control lines 15 preferably are connected to ADCE 13 via multiplexer 150. Although only two channels 11, 12 and two 2:1 multiplexers 140, 150 are shown, any number of channels can share ADCE 13 in this way. For n channels, each multiplexer 140, 150 preferably is an n:1 multiplexer. In use, a user of a PLD incorporating embodiment 10 preferably may select one of channels 11, 12 to connect to ADCE 13, which preferably would be implemented by selecting the same channel 11, 12 at each multiplexer 140, 150. As stated above, there also may be circumstances in which each of the different multiplexers 140, 150 is connected to a different one of channels 11, 12.

Figure 2:
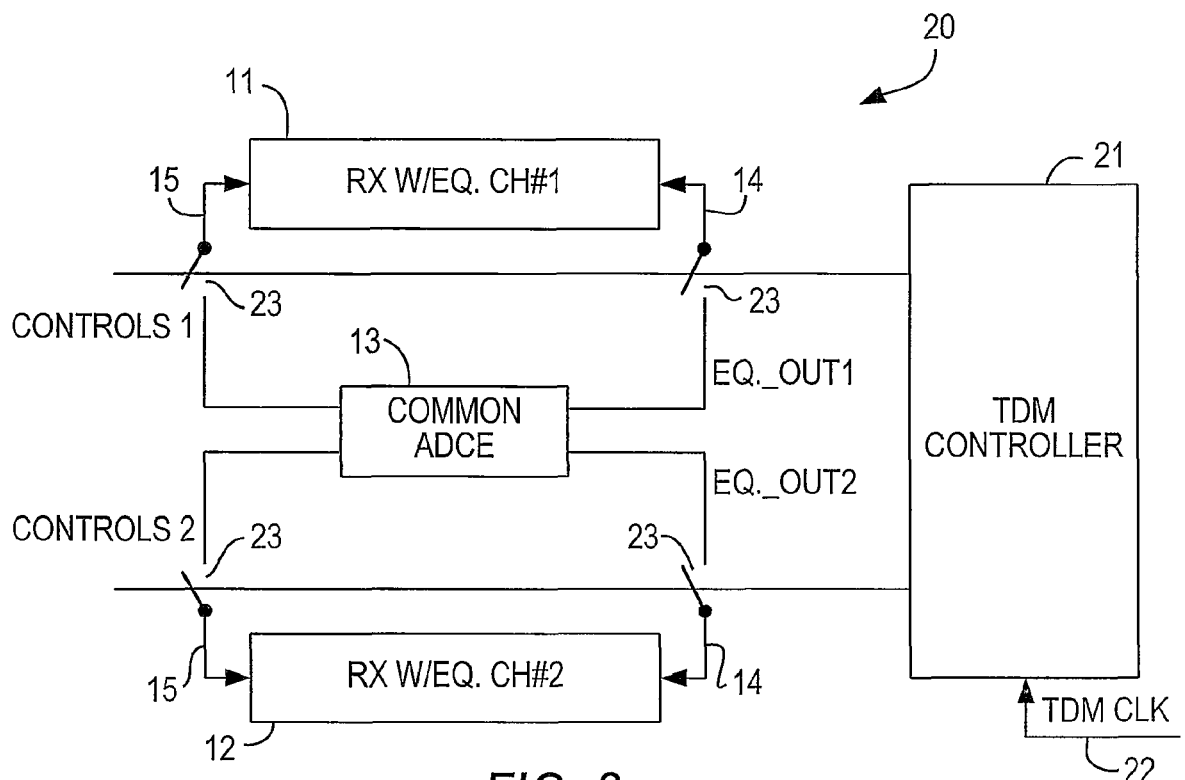
FIG. 2 is a schematic diagram of a portion of a programmable logic device according to a second preferred embodiment of the present invention.
Figure 3:
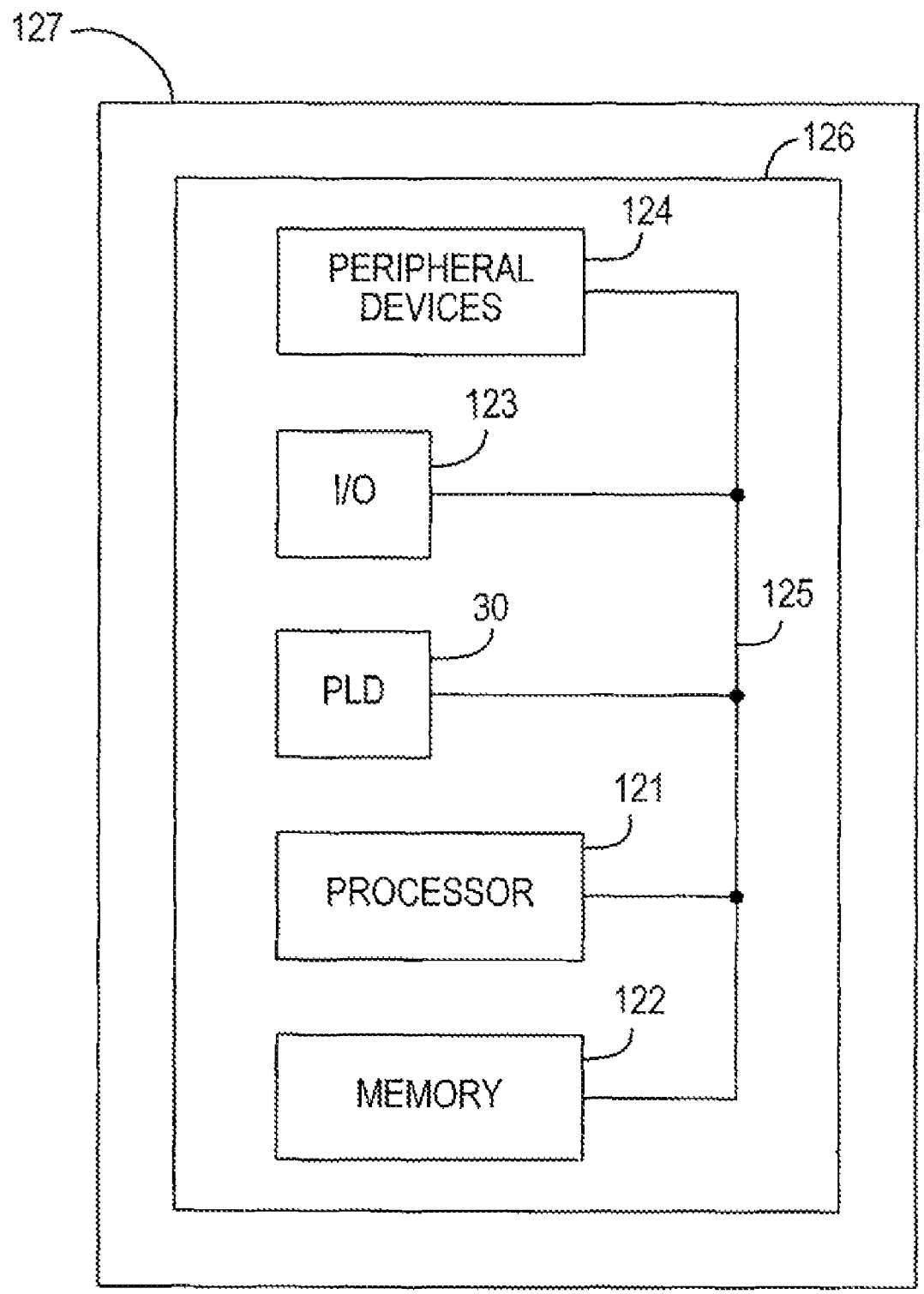
FIG. 3 is a simplified block diagram of an illustrative system employing a programmable logic device incorporating the present invention.

FIG. 2 illustrates the second embodiment described above, where one ADCE is provided for a plurality of channels, and services as many of those channels as the user logic design requires, using time-division multiplexing. In this embodiment 20, as in embodiment 10, each channel 11, 12 preferably includes equalization circuitry and the two channels 11, 12 preferably share a common ADCE 13. Again, each channel 11, 12 preferably is connected to ADCE 13 by a respective channel output 14 which carries signals indicating the states of various equalization settings in the respective channel, and by a respective control line 15 by which ADCE 13 adjusts those settings.

Embodiment 20 differs from embodiment 10 in that instead of having the respective channel outputs 14 and respective control lines 15 connected to ADCE 13 via multiplexers 140, 150, preferably respective channel outputs 14 and respective control lines 15 are connected to ADCE 13 via switches 23, which switch between lines 14, 15 of channel 11 and lines 14, 15 of channel 12 under control of time-division multiplexing controller 21 (which is clocked by a signal 22 that preferably comes from the PLD logic according the user logic design), so that all channels 11, 12 have access, in their respective time slots, to ADCE 13. Although only two channels 11, 12 and two sets of switches 23 are shown, any number of channels can share ADCE 13 in this way. As discussed above, assuming that the timing requirements can be met, it is even possible for one ADCE 13 to service all channels of the PLD.

A PLD 30 incorporating the present invention may be used in many kinds of electronic devices. One possible use is in a data processing system 120 shown in FIG. 3. Data processing system 120 may include one or more of the following components: a processor 121; memory 122; I/O circuitry 123; and peripheral devices 124. These components are coupled together by a system bus 125 and are populated on a circuit board 126 which is contained in an end-user system 127.

System 120 can be used in a wide variety of applications, such as computer networking, data networking, instrumentation, video processing, digital signal processing, or any other application where the advantage of using programmable or reprogrammable logic is desirable. PLD 30 can be used to perform a variety of different logic functions. For example, PLD 30 can be configured as a processor or controller that works in cooperation with processor 121. PLD 30 may also be used as an arbiter for arbitrating access to a shared resources in system 120. In yet another example, PLD 30 can be configured as an interface between processor 121 and one of the other components in system 120. It should be noted that system 120 is only exemplary, and that the true scope and spirit of the invention should be indicated by the following claims.

Various technologies can be used to implement PLDs 30 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A serial interface for use in a programmable logic device, said serial interface comprising:
   a first number of serial interface channels including equalization circuitry, said first number being at least two;
   a second number of adaptive dispersion compensation engines for adjusting said equalization circuitry, said second number being at least one and less than said first number; and selection circuitry for sharing each said adaptive dispersion compensation engine among a group of said serial interface channels including a third number of said serial interface channels from among said first number of said serial interface channels, said third number being at most equal to said first number.

2. The serial interface of claim 1 wherein said selection circuitry comprises a respective multiplexer for each said adaptive dispersion compensation engine.

3. The serial interface of claim 2 wherein said third number is two.

4. The serial interface of claim 3 wherein:
said first number is twice said second number; and
each of said first number of serial interface channels has access to one said adaptive dispersion compensation engine via said respective multiplexer.

5. The serial interface of claim 4 wherein:
said respective multiplexer comprises a first multiplexer for inputs to said adaptive dispersion compensation enging and a second multiplexer for outputs of said adaptive dispersion compensation engine; and
said first multiplexer and said second multiplexer select a same one of said group of a third number of channels.

6. The serial interface of claim 1 wherein said selection circuitry comprises respective time-division multiplexing circuitry for each said adaptive dispersion compensation engine.

7. The serial interface of claim 6 wherein said time-division multiplexing circuitry comprises:
at least one respective controllable switch for connecting each said serial interface channel in said group of serial interface channels to said adaptive dispersion compensation engine; and
a time-division multiplexing controller that operates said respective controllable switches to sequentially connect each said serial interface channel in said group of serial interface channels to said adaptive dispersion compensation engine.

8. The serial interface of claim 7 wherein:
said third number is equal to said first number; and
said second number is one.

9. The serial interface of claim 7 wherein said time-division multiplexing controller is programmable to give priority to one or more of said serial interface channels over others of said serial interface channels.

10. A programmable logic device comprising the serial interface of claim 1.

11. A digital processing system comprising:
processing circuitry;
a memory coupled to said processing circuitry; and
a programmable logic device as defined in claim 10 coupled to the processing circuitry and the memory.

12. A printed circuit board on which is mounted a programmable logic device as defined in claim 10.

13. The printed circuit board defined in claim 12 further comprising:
memory circuitry mounted on the printed circuit board and coupled to the programmable logic device.

14. The printed circuit board defined in claim 13 further comprising:
processing circuitry mounted on the printed circuit board and coupled to the memory circuitry.

15. A method of configuring a programmable logic device, said programmable logic device having a first number of serial interface channels including equalization circuitry, said first number being at least two, a second number of adaptive dispersion compensation engines for adjusting the equalization circuitry, the second number being at least one and less than the first number, and a respective multiplexer for each respective one of the adaptive dispersion compensation engines for sharing each respective adaptive dispersion compensation engine among a respective group of a third number of the serial interface channels from among the first number of the serial interface channels, the third number being at most equal to the first number, said method comprising:
for each said respective group, selecting which of said serial interface channels in said group is to be used with said adaptive dispersion compensation engine; and
for each respective group including a serial interface channel selected to be used with said adaptive dispersion compensation engine, configuring said respective multiplexer to connect said respective adaptive dispersion compensation engine to said one of said serial interface channels selected to be used.

16. A method of configuring a programmable logic device, said programmable logic device having a first number of serial interface channels including equalization circuitry, said first number being at least two, a second number of adaptive dispersion compensation engines for adjusting the equalization circuitry, the second number being at least one and less than the first number, and respective time-division multiplexer circuitry for each respective one of the adaptive dispersion compensation engines for sharing each respective adaptive dispersion compensation engine among a respective group of a third number of the serial interface channels from among the first number of the serial interface channels, the third number being at most equal to the first number, said method comprising:
for each said respective group, selecting which of said serial interface channels in said group are to be used with said respective adaptive dispersion compensation engine; and
for each respective group including a serial interface channel selected to be used with said adaptive dispersion compensation engine, configuring said respective time-division multiplexing circuitry to sequentially connect said respective adaptive dispersion compensation engine to each of said serial interface channels selected to be used.

17. The method of claim 16 wherein:
said third number equals said third number; and
said configuring said respective time-division multiplexing circuitry comprises configuring a single time-division multiplexing controller to sequentially connect a single adaptive dispersion compensation engine to all serial interface channels on said programmable logic device that are selected to be used with an adaptive dispersion compensation engine.

18. The method of claim 16 wherein said configuring said respective time-division multiplexing circuitry comprises assigning priority to one or more of said serial interface channels selected to be used with said adaptive dispersion compensation engine.

* * * * *